United States Patent
Chen et al.

(10) Patent No.: US 10,211,185 B2
(45) Date of Patent: Feb. 19, 2019

(54) HIGH EFFICIENCY CHIP-ON-BOARD LIGHT-EMITTING DIODE

(71) Applicant: BRIDGELUX, INC., Livermore, CA (US)

(72) Inventors: Peng Chen, Dublin, CA (US); Vladimir Odnoblyudov, Danville, CA (US); Zhengqing Gan, Clayton, CA (US)

(73) Assignee: BRIDGELUX INC., Fremont, CA (US)

( * ) Notice: Subject to any disclaimer, the term of this patent is extended or adjusted under 35 U.S.C. 154(b) by 278 days.

(21) Appl. No.: 14/929,138

(22) Filed: Oct. 30, 2015

(65) Prior Publication Data
US 2016/0123544 A1    May 5, 2016

Related U.S. Application Data

(60) Provisional application No. 62/073,928, filed on Oct. 31, 2014.

(51) Int. Cl.
*H01L 25/075* (2006.01)
*H01L 33/50* (2010.01)

(52) U.S. Cl.
CPC .......... *H01L 25/0753* (2013.01); *H01L 33/50* (2013.01); *H01L 2924/0002* (2013.01)

(58) Field of Classification Search
CPC ................. H01L 25/0753; H01L 33/50; H01L 2924/0002; F21K 9/56
USPC ....................................... 362/84; 257/98–100
See application file for complete search history.

(56) References Cited

U.S. PATENT DOCUMENTS

2001/0050530 A1* 12/2001 Murakami ............ H01L 33/145
                                                                       313/498
2009/0140271 A1*  6/2009 Sah .......................... F21K 9/00
                                                                        257/88

\* cited by examiner

*Primary Examiner* — Bao Q Truong
*Assistant Examiner* — Meghan Ulanday
(74) *Attorney, Agent, or Firm* — Arent Fox LLP

(57) ABSTRACT

An LED CoB structure with the combination use of blue and red LED dies is used to achieve warm white light, with good quantum conversion efficiency at a reasonably low cost. Both the red and blue LED dies are fabricated on transparent substrates. The current density of the LED dies is designed to match the different degradation rate of each type of LED die. The methods used to achieve high efficiency include adjusting the power, wavelength, and/or position of the dies.

6 Claims, 4 Drawing Sheets

HIGH EFFICIENCY CHIP-ON-BOARD LIGHT-EMITTING DIODE

CROSS REFERENCE TO RELATED APPLICATIONS

This application claims the benefit of U.S. Provisional Patent Application No. 62/073,928 entitled "HIGH EFFICIENCY CHIP-ON-BOARD LIGHT-EMITTING DIODE" which was filed on Oct. 31, 2014, the entirety of which is herein incorporated by reference.

BACKGROUND

Current light emitting device (LED) Chip-On-Board (CoB) architectures generate white light through the combination of blue LED dies and phosphors. To achieve warm white light, red phosphors are usually added to convert part of the blue light emitted from blue LED die into red light. The quantum conversion efficiency of red phosphors is usually low and the cost of red phosphors is high.

SUMMARY

Several aspects of the present invention will be described more fully hereinafter with reference to various apparatuses.

In accordance with one embodiment of the invention, red LED dies fabricated on transparent substrates are used in combination with blue LED dies also fabricated on transparent substrates to achieve high efficiency Chip-On-Board (CoB) LED dies. In one embodiment, the transparent substrate is a sapphire-substrate. Optimized designs that address different degradation mechanisms for red and blue dies are used to obtain long-term stability and reliability. One approach for optimizing degradation is to use different current densities for the blue and red LED dies. Alternatively, the same current can be used with different sizes of red and blue LED dies. By changing the different sizes of the red and blue LED dies the current densities are changed.

It is understood that other aspects of apparatuses will become readily apparent to those skilled in the art from the following detailed description, wherein various aspects of apparatuses and methods are shown and described by way of illustration. As understood by one of ordinary skill in the art, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatuses will now be presented in the detailed description by way of example, and not by way of limitation, with reference to the accompanying drawings, wherein.

DETAILED DESCRIPTION

Figure 1:
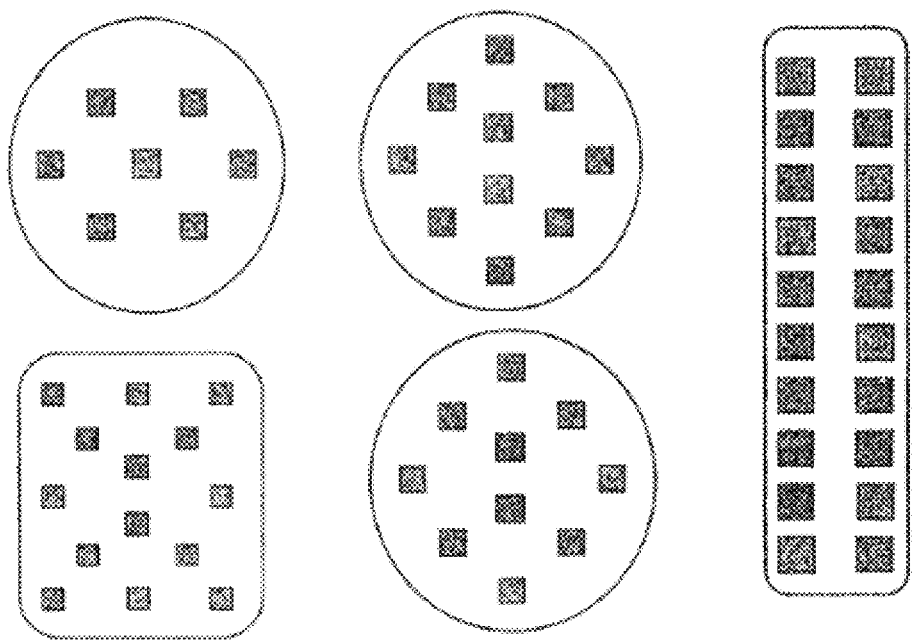
FIG. 1 illustrates several examples showing the mix of red dies with blue dies in an LED CoB platform.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus, method or article of manufacture does not require that all embodiments of the invention include the described components, structure, features, functionality, processes, advantages, benefits, or modes of operation.

The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus or method. Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "beneath" or "bottom" and "above" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being "above" other elements would then be oriented "below" other elements and vice versa. The term "above", can therefore, encompass both an orientation of "above" and "below," depending of the particular orientation of the apparatus. Similarly, if an apparatus in the drawing is turned over, elements described as "below" other elements would then be oriented "above" the other elements. The terms "below" can, therefore, encompass both an orientation of above and below.

It will be further understood that the terms "comprises" and/or "comprising," when used in this specification, specify the presence of stated features, steps, operations, elements, and/or components, but do not preclude the presence or addition of one or more other features, integers, steps, operations, elements, components, and/or groups thereof. The term "and/or" includes any and all combinations of one or more of the associated listed items.

Unless otherwise defined, all terms (including technical and scientific terms) used herein have the same meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In the following detailed description, various aspects of the present invention will be presented in the context of a light emitting device (LED) chip-on-board (CoB) platform. However, those skilled in the art will realize that these aspects may be extended to other apparatus and/or their features, operations, elements, and/or components. Accordingly, any reference to a light-emitting device is intended only to illustrate the various aspects of the present invention, with the understanding that such aspects may have a wide range of applications.

In one embodiment, red LED dies fabricated on transparent substrates are used in combination with blue LED dies fabricated on transparent substrates to achieve high efficiency CoB. In one embodiment, the transparent substrate is a sapphire-substrate. Optimized designs that address different degradation mechanisms for red and blue dies are used to obtain long-term stability and reliability. One approach for optimizing degradation is to use different current densities for the blue and red LED dies. Alternatively, the same current can be used with different sizes of red and blue LED dies. By changing the different sizes of the red and blue LED dies the current densities are changed.

FIG. 1 illustrates several examples showing a mix of red LED dies with blue LED dies in an LED CoB platform. The various examples illustrated show one or more red LED dies disposed in between the blue LED dies to provide a more uniform color distribution.

Figure 2:
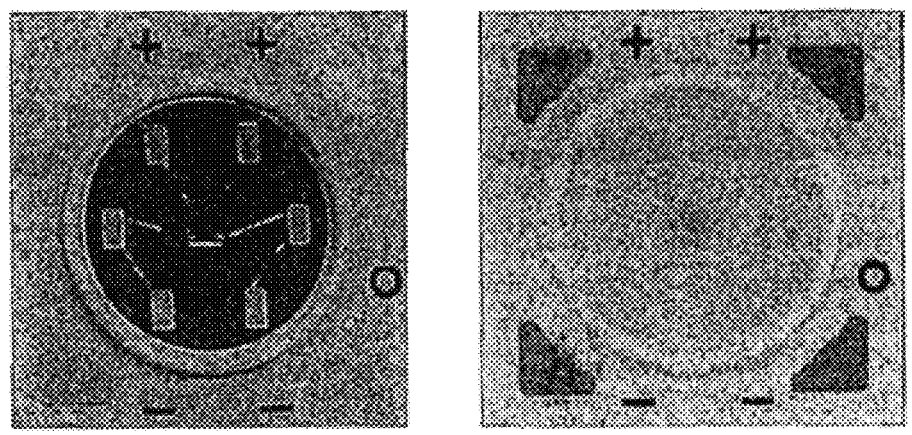
FIG. 2 illustrates a front view of one embodiment having a mix of red dies and blue dies in an LED CoB.

FIG. 2 illustrates a front view of one embodiment having a mix of red LED dies and blue LED dies in an LED CoB. In one embodiment, the array includes several blue LED dies and a single red LED die. The blue LED dies are arranged in several strings with the common red LED die. Specifically, each string of blue LED dies is electrically connected to the single red LED die. In one embodiment, all of the blue and red LED dies are covered with the same light conversion material (phosphor in one example).

Figure 3:
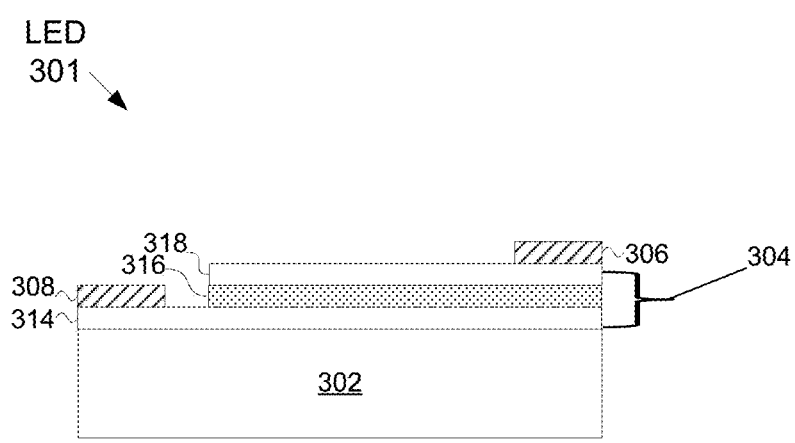
FIG. 3 is a cross sectional view of a single die (either red or blue) used in the arrays illustrated in FIG. 1.

FIG. 3 is a cross sectional view of a single LED die 301 (either red or blue) used in the arrays illustrated in FIG. 1. An LED die comprises a semiconductor material impregnated, or doped, with impurities. These impurities add "electrons" or "holes" to the semiconductor, which can move in the material relatively freely. Depending on the kind of impurity, a doped region of the semiconductor can have predominantly electrons or holes, and is referred respectively as n-type or p-type semiconductor regions.

Referring to FIG. 3, the LED die 301 includes an n-type semiconductor region 314 and a p-type semiconductor region 318. A reverse electric field is created at the junction between the two regions, which causes the electrons and holes to move away from the junction to form an active region 316. When a forward voltage sufficient to overcome the reverse electric field is applied across the p-n junction through a pair of electrodes 308, 306, electrons and holes are forced into the active region 316 and recombine. When electrons recombine with holes, they fall to lower energy levels and release energy in the form of light.

In this example, the n-type semiconductor region 314 is formed on a substrate 302, which may be a transparent substrate. The p-type semiconductor region 318 is formed on the active layer 316. However, the regions 314 and 318 may be reversed. That is, the p-type semiconductor region 318 may be formed on the substrate 302 and the n-type semiconductor region 314 may formed on the active layer 316. As those skilled in the art will readily appreciate, the various concepts described throughout this disclosure may be extended to any suitable layered structure. Additional layers or regions (not shown) may also be included in the LED 301, including but not limited to buffer, nucleation, contact and current spreading layers or regions, as well as light extraction layers.

The p-type semiconductor region 318 is exposed at the top surface, and therefore, the p-type electrode 306 may be readily formed thereon. However, the n-type semiconductor region 314 is buried beneath the p-type semiconductor layer 318 and the active layer 316. Accordingly, to form the n-type electrode 308 on the n-type semiconductor region 314, a cutout area or "mesa" is formed by removing a portion of the active layer 316 and the p-type semiconductor region 318 by means well known in the art to expose the n-type semiconductor layer 314 there beneath. After this portion is removed, the n-type electrode 308 may be formed.

In some embodiments, as illustrated in FIGS. 1-3, an LED CoB structure with a combination of blue and red dies is used to achieve warm white light, with good quantum conversion efficiency at a reasonably low cost. Both types of red and blue dies are fabricated on transparent substrates, such as substrate 302. The transparent substrates can be sapphire. The current density of the dies is designed to match the different degradation rate of each type of dies. The methods used to achieve high efficiency include adjusting the power, wavelength, and/or position of dies.

In one embodiment, a lighting system includes a plurality of blue LED dies fabricated on transparent substrates, at least one second LED die fabricated on a transparent substrate. The second LED die is configured to emit light that is different than blue light. The plurality of blue LEDs and the second LED are disposed on a common substrate and are covered by a common light conversion material. The at least one second LED can be a red emitting LED. Alternatively, the at least one second LED can be a green emitting LED. Alternatively, the at least one second LED can include at least one red emitting LED and one green emitting LED.

In another embodiment, the plurality of blue LEDs and the least one second LED can be configured to operate at different current densities. The current density of the plurality of blue LEDs can be twice as much as the current density of the at least one second LED.

In another embodiment, the plurality of blue LEDs and the at least one second LED can be electrically coupled into at least two different strings, the two different strings being electrically connected to at least one of the second LEDs.

Figure 4A:
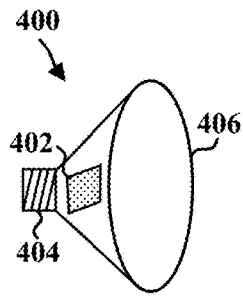
FIGS. 4a-4c are side view illustrations of various exemplary apparatuses having a light emitting apparatus comprising an LED CoB structure.

FIG. 4a is a side view illustration of an exemplary lamp 400 having a light emitting apparatus 402. The light emitting apparatus 402 may comprise an LED CoB. Lamp 400 may be used for any type of general illumination. For example, lamp 400 may be used in an automobile headlamp, street light, overhead light, or in any other general illumination application. The light emitting apparatus 402 may be located in a housing 406. The light emitting apparatus 402 may receive power via a power connection 404. As discussed above, the light emitting apparatus 402 may receive 110V of power or 220V of power and still operate normally. The light emitting apparatus 402 may be configured to emit light. Description pertaining to the process by which light is emitted by the light-emitting apparatus 402 is provided with reference to FIGS. 2-4.

Figure 4B:
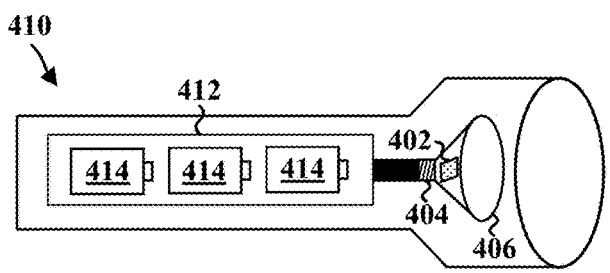

FIG. 4b is a side view illustration of a flashlight 410, which is an exemplary embodiment of an apparatus having the light emitting apparatus 402. The light emitting apparatus 402 may be located inside of the housing 406. The flashlight 410 may include a power source. In some aspects of the light emitting apparatus, the power source may include batteries 414 located inside of a battery enclosure 412. In another aspect of the light emitting apparatus, power source 410 may be any other suitable type of power source, such as a solar cell. The power connection 404 may transfer power from the power source (e.g., the batteries 414) to the light-emitting apparatus 402.

Figure 4C:
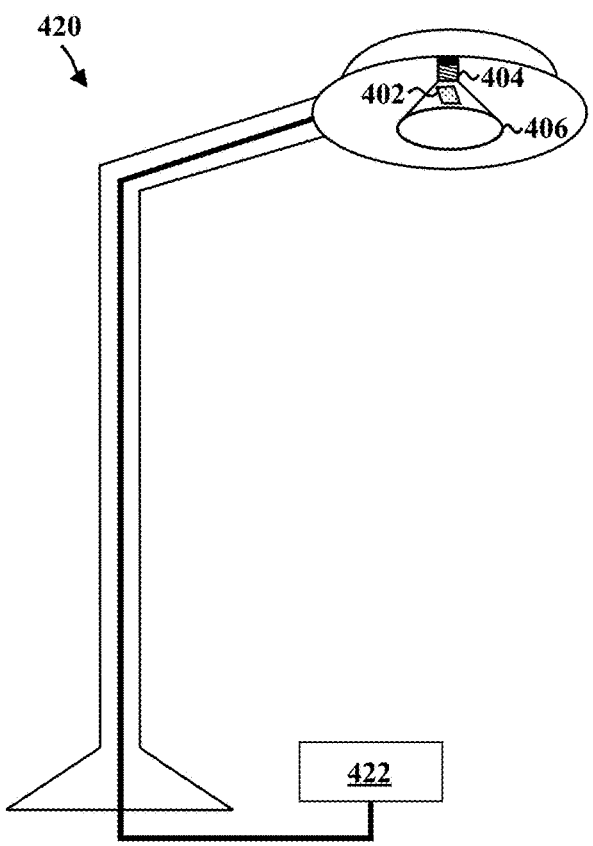

FIG. 4c is a side view illustration of a street light 420, which is another exemplary embodiment of an apparatus having the light emitting apparatus 402. The light emitting apparatus 402 may be located inside of the housing 406. The street light 420 may include a power source. In some exemplary embodiments, the power source may include a power generator 422. The power connection 404 may transfer power from the power source (e.g., the power generator 422) to the light emitting apparatus 402.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A lighting system, comprising:
   a plurality of blue LED dies, each fabricated on at least one transparent substrate;
   at least one other LED die fabricated on the at least one transparent substrate, the at least one other LED die configured to emit light that is different than blue light;
   wherein the plurality of blue LED dies and the at least one other LED die are disposed on a common substrate and are covered by a common light conversion material, and
   wherein the plurality of blue LED dies and the at least one other LED die are configured to operate at different current densities to match respective degradation rates of the respective dies.

2. The lighting system of claim 1 wherein the at least one other LED die comprises a red emitting LED die.

3. The lighting system of claim 1 wherein the at least one other LED die comprises a green emitting LED die.

4. The lighting system of claim 1 wherein the at least one other LED die comprises one red emitting LED die and one green emitting LED die.

5. The lighting system of claim 1, wherein the current density of the plurality of blue LED dies is twice as much as the current density of the at least one other LED die.

6. The lighting system of claim 1, wherein the plurality of blue LED dies and the at least one other LED die are electrically coupled into at least two different strings, the two different strings being electrically connected to at least one of the other LED dies.

* * * * *